(12) United States Patent
Chang

(10) Patent No.: US 8,830,724 B2
(45) Date of Patent: Sep. 9, 2014

(54) METHODS OF OPERATING PRAMS USING INITIAL PROGRAMMED RESISTANCES AND PRAMS USING THE SAME

(75) Inventor: Sang Hoan Chang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 488 days.

(21) Appl. No.: 13/168,553

(22) Filed: Jun. 24, 2011

(65) Prior Publication Data

US 2012/0087183 A1    Apr. 12, 2012

(30) Foreign Application Priority Data

Oct. 12, 2010   (KR) ................ 10-2010-0099366

(51) Int. Cl.
*G11C 11/00* (2006.01)

(52) U.S. Cl.
USPC ............ 365/148; 365/163; 365/171; 365/173

(58) Field of Classification Search
USPC .................. 365/148, 163, 171, 173
See application file for complete search history.

(56) References Cited

U.S. PATENT DOCUMENTS

| 7,493,531 | B2 | 2/2009 | Ito et al. |
| 2005/0281112 | A1 | 12/2005 | Ito et al. |
| 2008/0062769 | A1 | 3/2008 | Blacquiere et al. |
| 2010/0321995 | A1* | 12/2010 | Sarin ........................ 365/185.2 |
| 2011/0075473 | A1* | 3/2011 | Park et al. .................. 365/163 |

* cited by examiner

*Primary Examiner* — Hien Nguyen
(74) *Attorney, Agent, or Firm* — Myers Bigel Sibley & Sajovec, P.A.

(57) ABSTRACT

A method of operating a PRAM device includes reading a PRAM reference cell to determine an initial programmed resistance of the PRAM reference cell and determining whether the initial programmed resistance has been reduced to below a predetermined reference threshold resistance.

19 Claims, 22 Drawing Sheets

METHODS OF OPERATING PRAMS USING INITIAL PROGRAMMED RESISTANCES AND PRAMS USING THE SAME

CROSS-REFERENCE TO RELATED APPLICATIONS

This application claims priority under 35 U.S.C. §119 to Korean Patent Application No. 10-2010-0099366 filed on Oct. 12, 2010, in the Korean Intellectual Property Office, the disclosure of which is incorporated herein by reference.

BACKGROUND

The inventive concept relates to the field of semiconductors, and more particularly, to phase change memory devices.

A phase change memory device, such as a Phase Change Random Access Memory (PRAM), can include a phase change material, such as a chalcogenide alloy of germanium, antimony, and tellurium, which can be used to store data by inducing the phase change material to take on a crystalline state or an amorphous state. In particular, the resistance of the phase change material can be greater in the amorphous state than in the crystalline state.

In a read operation of the phase change memory device, current can be supplied to a selected phase change memory cell whereupon different tunneling currents can develop depending on the resistance of a phase change material in the cell. A sense amplifier coupled to the selected cell can compare a reference level with a level of a sensing node which changes according to the tunneling current to help distinguish between the stored data.

The data stored in phase change memory devices can be reliable for about 60 years at temperatures up to about 85 degrees Centigrade. Errors may, however, be induced in data that is exposed to higher temperatures. For example, data that is exposed to temperatures of 105 degrees Centigrade may only be reliable for about 6 months.

SUMMARY

Embodiments according to the inventive concept can provide methods of operating PRAM devices using initial programmed resistances and PRAM devices using the same. Pursuant to these embodiments, a method of operating a PRAM device can be provided by reading a PRAM reference cell to determine an initial programmed resistance of the PRAM reference cell and determining whether the initial programmed resistance has been reduced to below a predetermined reference threshold resistance.

In some embodiments according to the inventive concept, the predetermined reference threshold resistance is greater than a predetermined data threshold resistance that is used to distinguish between different data states stored in a PRAM data cell. In some embodiments according to the inventive concept, first resistances that are greater than the predetermined data threshold resistance represent a reset state of the PRAM data cell and second resistances that are less than the predetermined data threshold resistance represent a set state of the PRAM data cell.

In some embodiments according to the inventive concept, the PRAM can be read by repeatedly reading the PRAM reference cell without an intervening rewrite operation of the PRAM reference cell until determining that the initial programmed resistance of the PRAM reference cell has been reduced to below the predetermined reference threshold resistance and then rewriting the PRAM reference cell to have the initial programmed resistance.

In some embodiments according to the inventive concept, a method of operating a PRAM device can be provided by programming a plurality of PRAM reference cells to have a statistical distribution of reference resistances that falls between and is non-overlapping a statistical distribution of resistances for a reset state for data stored in the PRAM and a predetermined reference threshold resistance that is greater than a predetermined data threshold resistance used to distinguish between the reset state and a set state for the data stored in the PRAM. A plurality of PRAM reference cells are read to determine whether an initial programmed resistance of at least one of the plurality of PRAM reference cells has been reduced to below the predetermined reference threshold resistance.

In some embodiments according to the inventive concept, the method can further provide periodically reading the plurality of PRAM reference cells to determine that the initial programmed resistance of at least one of the plurality of PRAM reference cells has been reduced to below the predetermined reference threshold resistance. A plurality of PRAM data cells associated with the at least one of the plurality of PRAM reference cells are read to provide read data. The read data is rewritten to the plurality of PRAM data cells associated with the at least one of the plurality of PRAM reference cells. In some embodiments according to the inventive concept, the method can also include rewriting the at least one of the plurality of PRAM reference cells to be within the statistical distribution of reference resistances.

DESCRIPTION OF EMBODIMENTS ACCORDING TO THE INVENTIVE CONCEPT

Figure 1:
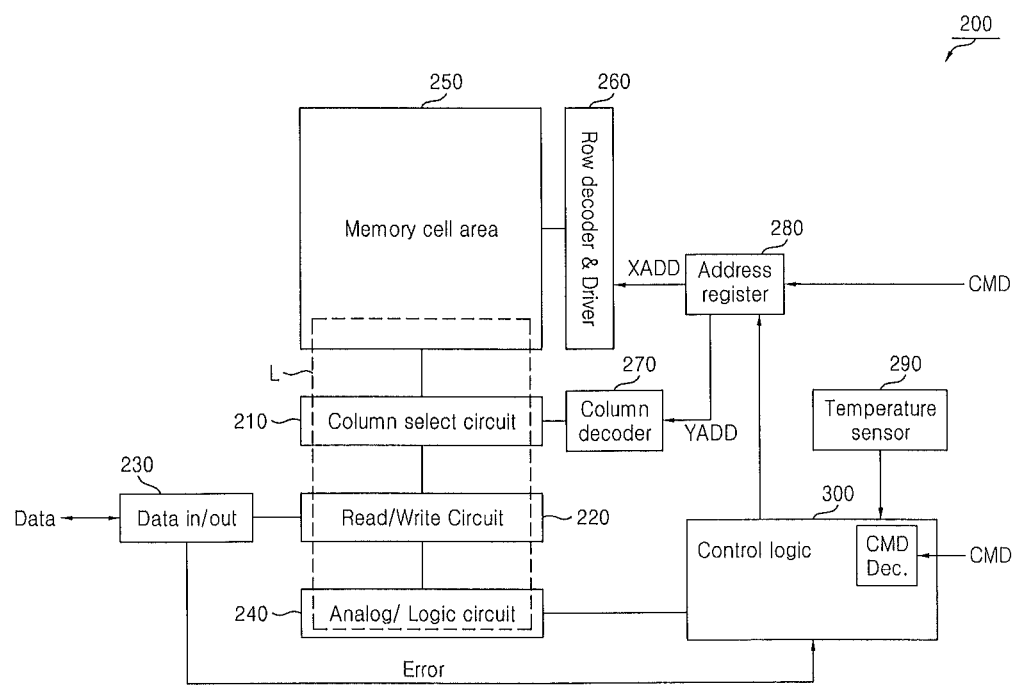
FIG. 1 is a block diagram of a PRAM device in some embodiments according to the inventive concept.

The inventive concept is described more fully hereinafter with reference to the accompanying drawings, in which embodiments of the inventive concept are shown by way of example. The inventive concept may, however, be embodied in many different forms and should not be construed as limited to the example embodiments set forth herein. Rather, these example embodiments are provided so that this disclosure will be thorough and complete, and will fully convey the scope of the inventive concept to those skilled in the art.

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

It will be understood that the term "initial programmed resistance" represents the resistance value initially programmed to the selected reference cell, and is stored therein without an intervening rewrite operation. In other words, the initial programmed resistance includes the value which is initially programmed and those subsequently reduced when subjected to excessive temperatures. Once a rewrite operation is performed, however, a new initial programmed resistance is stored by the reference cell. The term "resistance" is used herein to refer to values that are written to and read from the reference and data cells. It will be understood that the resistance values are interchangeable with voltage values as the respective values can be proportional to one another. Accordingly, when a resistance value is said to have been read from a cell, it will be understood that the resistance may be actually represented by a proportional voltage.

FIG. 1 is a block diagram of a Variable Resistance Memory device 200 according to some embodiments of the inventive concept. The Variable Resistance Memory device 200 may be a phase-change random access memory (PRAM) device, but the inventive concept is not restricted thereto. The Variable Resistance Memory device 200 may be a magnetic RAM (MRAM) device, a resistive RAM (RRAM) device, a ferroelectric RAM (FeRAM) device or a Spin Transfer Torque-Magnetic Random Access Memory (STT-MRAM). The PRAM device 200 includes a memory cell area 250, a column select circuit 210, a column decoder circuit 270, a row decoder and driver circuit 260, an address register circuit 280, a read/write circuit 220, a data input/output circuit 230, an analog/logic circuit 240, and control logic circuit 300. The PRAM device 200 may further include a temperature sensor circuit 290.

The memory cell area 250 includes a plurality of bit lines, a plurality of word lines, and a memory cell array including a plurality of phase change memory cells connected to the bit lines and the word lines. The memory cell array can be divided into partitions, where each partition can include a plurality of tiles. In addition, a group of the phase change memory cells can be defined as a unit, such a block, for which a rewrite operation can be performed when, for example, the phase change memory cells in the group should be re-programmed to address the likelihood that the data stored therein may otherwise be lost due to excessive temperature. In some embodiments according to the inventive concept, whether to perform a rewrite can be determined on a block by block basis. The blocks may include a plurality of data cells and at least one reference cell.

It will be understood that a data cell is configured to store data specified by, for example, a user of a system in which the PRAM device is included. In contrast, a reference cell is configured to store an initial programmed resistance that can be used to determine whether the data stored in the PRAM device is more likely to be in-error due to excessive temperatures. For example, in some embodiments according to the inventive concept, the initial programmed resistance can be reduced when exposed to excessive temperatures, which can be detected during a read operation if the initial programmed resistance has fallen below a predetermined reference threshold resistance.

The predetermined reference threshold resistance can be selected to be greater than a predetermined data threshold resistance so that the reduction in the initial programmed resistance can provide an early warning of the occurrence of an error in the cells used to store the data, before the resistance of the data cells is reduced below a threshold used to distinguish between states of the data. Upon a determination that an error make be likely if unaddressed, the data cells and the reference cell can be rewritten to help avoid an error in the data. In some embodiments according to the inventive concept, the reference cell may be a redundant cell or a dummy cell in the memory cell array.

The row decoder and driver circuit 260 decodes a row address XADD output from the address register circuit 280 and selects at least one word line (i.e., a row) from among the plurality of word lines. The column decoder circuit 270 decodes a column address YADD output from the address register circuit 280 and selects at least one bit line (i.e., a column) from among the plurality of bit lines.

The read/write circuit 220 writes data, provided via the data in/out circuit 230, to the selected memory cells. The read/write circuit 220 can also perform a verify-read or a read operation on the data stored in the selected memory cells. In some embodiments according to the inventive concept, the data in/out circuit 230 generates an error signal when an error has been detected during a read of a reference cell. The error signal can be provided to the control logic circuit 300, which can then generate a rewrite operation to data cells associated with the reference cell that generated the error signal. For example, in some embodiments according to the inventive concept, a read is performed to a selected reference cell and to data cells that are associated with the selected reference cell. When the error signal is generated, the control logic circuit 300 can cause the data read from the data cells to be maintained in (or returned to) the read/write circuit 220 so that a rewrite of data can be performed.

For example, in some embodiments according to the inventive concept, the control logic circuit 300 can be used to determine whether to perform a rewrite operation based on a result from reading a reference cell and, when a failure on the read of the reference cell occurs, the read/write circuit 220 is controlled to rewrite the data that was read from the data cells back into the selected memory cells from which the data was read. In some embodiments according to the inventive concept, the read/write circuit 220 is also controlled to rewrite the initial programmed resistance back into the selected reference cell that generated the error on the read operation.

The control logic circuit 300 decodes a command CMD, such as a write command or a read command, and transmits a signal to the analog/logic circuit 240 so that the command CMD is executed. In addition, the control logic circuit 300 receives temperature information from the temperature sensor circuit 290, which can be accessed by, for example, a host or controller circuit configured to operate the system in which the PRAM device 200 is included. The temperature information provided to the control logic circuit 300 can also be used to determine whether data stored in the data cells in the memory cell area 250 should be rewritten.

Figure 2:
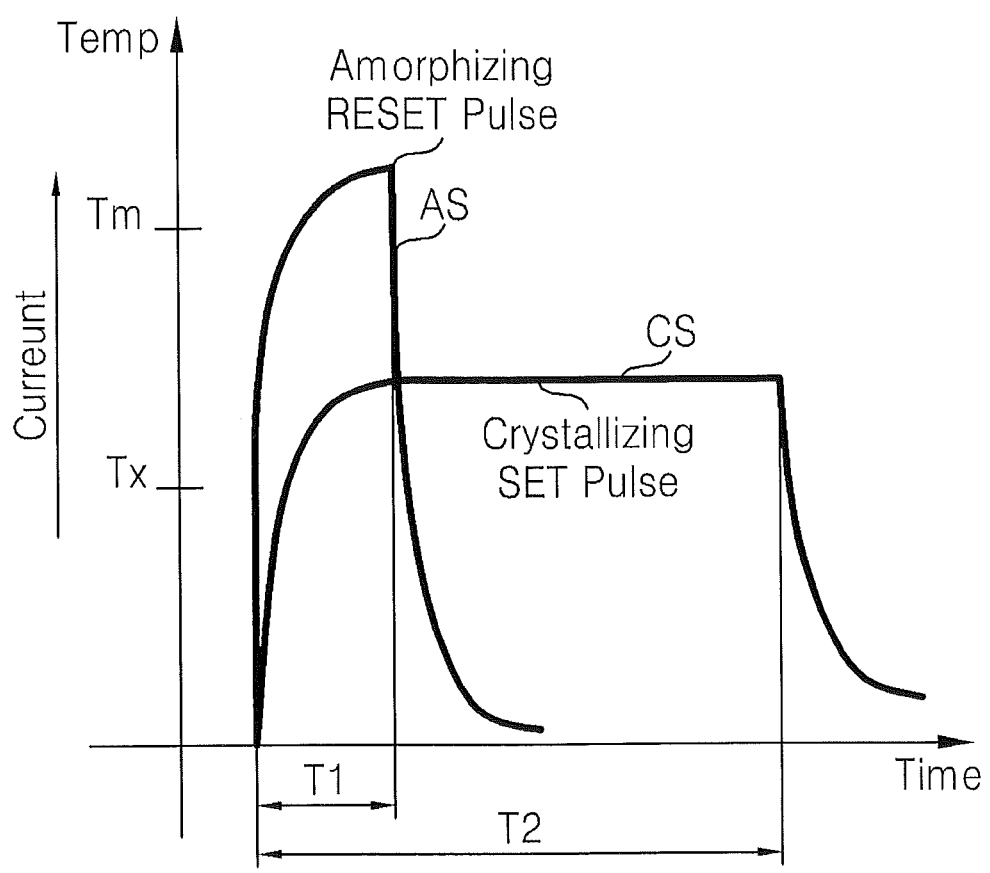
FIG. 2 is a graph illustrating currents applied to place a phase change material in different states.

FIG. 2 is a graph illustrating currents applied to place a phase change material in different states. The phase change material may be a compound of two elements such as GaSb, InSb, InSe, $Sb_2Te_3$, or GeTe, a compound of three elements such as GeSbTe, GaSeTe, InSbTe, $SnSb_2Te_4$, or InSbGe, or a compound of four elements such as AgInSbTe, (GeSn)SbTe, GeSb(SeTe), or $Te_{81}Ge_{15}Sb_2S_2$. Other compounds may be used.

In some embodiments according to the inventive concept, a phase change memory cell can be placed in one of two stable states, i.e., a crystalline state or an amorphous state. The amorphous state may be referred to as a reset state corresponding to a logic "1", which has a resistance that is greater than a predetermined data threshold resistance (used to distinguish between states). The crystalline state may be referred to as a set state corresponding to a logic "0", which has a resistance that is less than the predetermined data threshold resistance. It will be understood that in some embodiments according to the inventive concept, the logic values assigned to the reset and set states may be the reverse of that described above.

The phase change material may be heated using any technique, such as a laser beam or a current. In FIG. 2, a curve AS denotes a profile of a current waveform that can be applied to place a selected cell in the amorphous state, whereas the curve CS denotes a profile of a current waveform that can be applied to place the selected cell in the crystalline state For example, when the phase change material is heated to a temperature that is greater than a melting temperature Tm using the current waveform AS during a first time period T1, and then rapidly quenched, the phase change material changes to the amorphous state. When the phase change material is heated to a temperature that is less than the melting temperature Tm, but greater than a crystallization temperature Tx using the current waveform CS supplied during a second time period T2 (where T2>T1) and then gradually quenched, the phase change material changes to the crystalline state.

Figure 3:
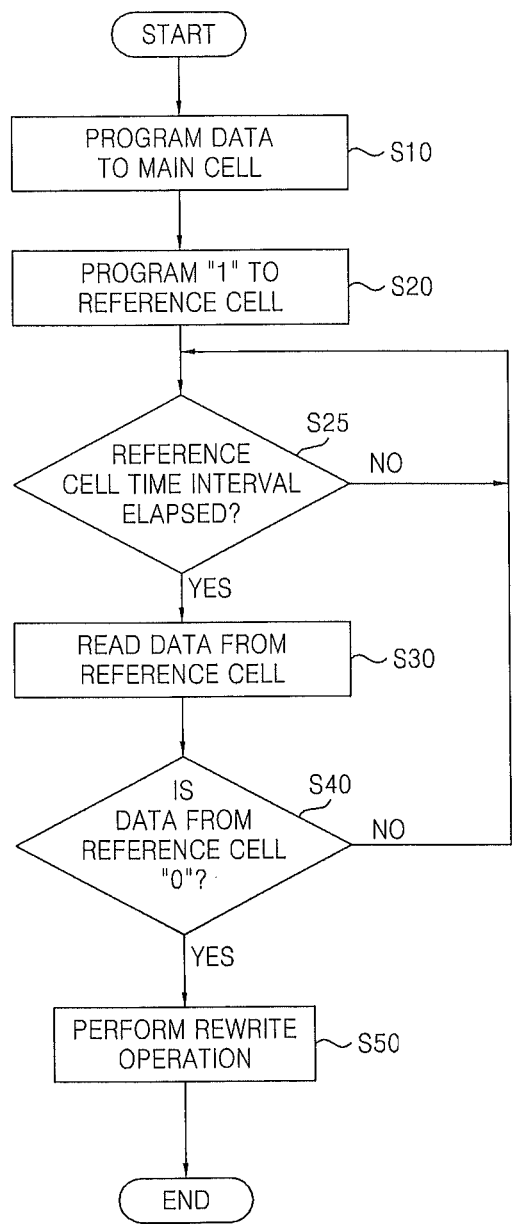
FIG. 3 is a flowchart of operations of a PRAM device in some embodiments according to the inventive concept.

FIG. 3 is a flowchart of operations of a PRAM device in some embodiments according to the inventive concept. The PRAM device 200 stores received data in selected data cells (S10). As appreciated by the present inventors, if the PRAM device 200 is exposed to excessive temperatures, the amorphous state (the reset state) may degrade into the crystalline state (the set state) so that, if unaddressed, a data error may occur. As further appreciated by the present inventors, a reference cell associated with the data cells of S10 can be programmed to have an initial programmed resistance which is greater than a predetermined data threshold resistance (e.g., a logic "1) (S20). In some embodiments according to the inventive concept, the reference cell can be proximate to the data cells in S10 or in the same memory block as the data cells in S10.

A current supplied to program the reference cell to have the initial programmed resistance may be equal to or less than a current used to program the data cells in the amorphous state. When the current supplied to place the reference cell in the amorphous state is less than the current supplied to the data cell in the amorphous state, the reference cell may degrade to the crystalline state (i.e., a logic "0" on a read) before the data cells degrade to the crystalline state.

A reference cell time interval may be used to periodically read the reference cell of S20 (S25). The reference cell time interval can cause the controller or host to wait until the time interval elapses before initiating a read of the reference cell in S20. When the time interval elapses, a read operation is performed on the reference cell along with the data cells associated with the reference cell (S30). If the data read from the reference cell is a logic "1" (in the amorphous state) no error in the reference data is detected and operations continue at S25 after the time interval is reset. If, however, the data read from the reference cell is a logic "0" (in the crystalline state) an error signal is generated indicating that the initial programmed resistance of the reference cell has been reduced to below a predetermined reference threshold resistance, which in the present embodiment according to the inventive concept, is equal to the predetermined data threshold resistance. It will be understood, however, that in some embodiments according to the present invention, the predetermined reference threshold resistance can be greater than predetermined data threshold resistance.

It will be understood that each reference cell can have an associated reference cell time interval, which indicates when a read operation is to be performed to the associated reference cell. The different reference cell time intervals can be based, for example, on an indication from the temperature sensor circuit 290 in the PRAM device 200, the location of the reference cell in the array, historical error analysis of the PRAM device 200, or a combination of these parameters. In some embodiments according to the inventive concept, the PRAM device 200 may include a plurality of temperature sensor circuits 290 configured to provide temperature information associated with respective reference cells or predetermined regions in the array. In some embodiments according to the inventive concept, the time interval can be based on previous intervals over which the initial programmed resistance of the reference cell degraded to less than the predetermined reference threshold resistance. Other parameters can also be used.

In some embodiments according to the inventive concept, a rewrite operation is performed to the data and reference cells in response to the data failure occurring when reading the reference cell (S50). Moreover, because the data cells were programmed in the amorphous state to have a resistance greater than the initial programmed resistance, the amorphous state of the data cells may still be intact despite the excessive temperature due to the fact that the initial programmed resistance of the reference cell fell below the predetermined data threshold resistance first to provide an early warning of a future error in the data cells. The rewrite operation may, therefore, increase the resistance of the data cells before a data error occurs. Operations continue at S25 after the time interval is reset.

Figure 4:
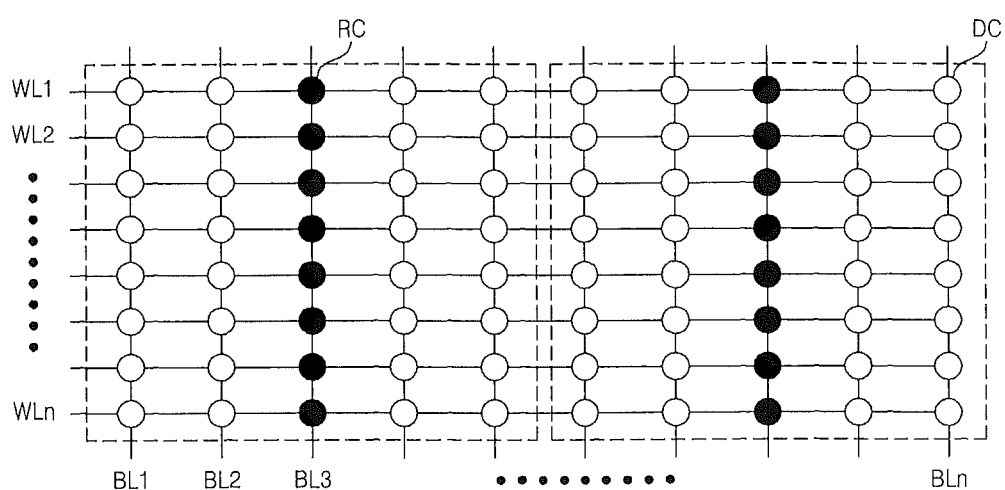
FIG. 4 is a diagram illustrating an arrangement of reference cells and data cells in a PRAM device in some embodiments according to the inventive concept.
Figure 5:
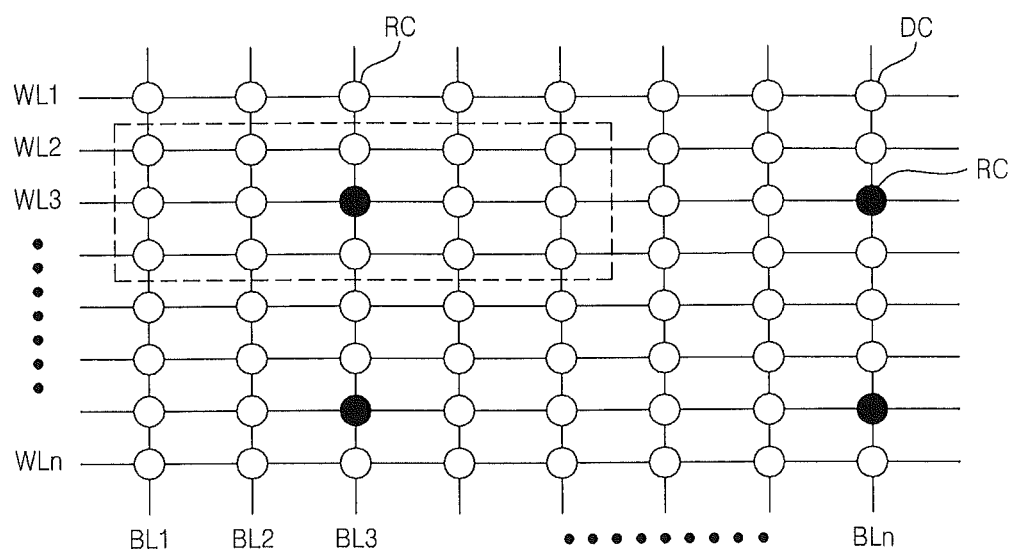
FIG. 5 is a diagram illustrating an arrangement of reference cells and data cells in a PRAM device in some embodiments according to the inventive concept.

FIGS. 4 and 5 are diagrams illustrating arrangements of reference cells and data cells in a PRAM device in some embodiments according to the inventive concept. The memory cell arrays in FIGS. 4 and 5 are each divided into pluralities of memory blocks for which rewrite operations can be performed. Each memory block includes a plurality of data cells DC and at least one associated reference cell RC. The data cells DC are used to store data, whereas the reference cells RC are used to store reference data (i.e., logic "1") rather than to store user specified data. The reference cell RC is used to indicate temperature information, such as thermal energy and temperature change, related to the PRAM device 200, which may indicated that a rewrite may be needed. In some embodiments according to the inventive concept, the reference cells RC and the data cells have the same structure and may be formed using the same process.

Referring to FIG. 4, the memory cell array may be divided into a plurality of partitions each including a plurality of tiles, exemplary tiles being illustrated by the dotted regions. Each memory block in the array may include at least one partition or at least one tile. In the memory cell array, a plurality of data cells DC are connected between word lines WL0-WLn and bit lines BL0-BLn and a plurality of reference cells RC are connected between a particular bit line, e.g., BL3, and the word lines WL0-WLn. Accordingly, a reference cell can be associated with a particular row of data cells. When a rewrite is performed, the data cells in each of the rows in the tile may be rewritten (as well as the row including the reference cell that generated the error). Further, the reference cells can be located in the array at locations where high temperatures may be expected to occur, and therefore, may give advanced warning of imminent failure of the associated data cells. Fr example, in some embodiments according to the inventive concept, the reference cells can be located proximate to current driver circuits or proximate to the central portions of the array or tile.

Referring to FIG. 5, a memory block may be defined based on thermal stress obtained through monitoring or testing of the phase change memory device 200. For example, memory cells having the same or similar thermal stress may be logically grouped into the same memory block. Reference cells RC may be positioned at particular locations between memory blocks and at a particular spacing. In some embodiments according to the inventive concept, a cell that is prone to failure may be selected as a reference cell based on the results of monitoring or testing the PRAM device 200.

Figure 6:
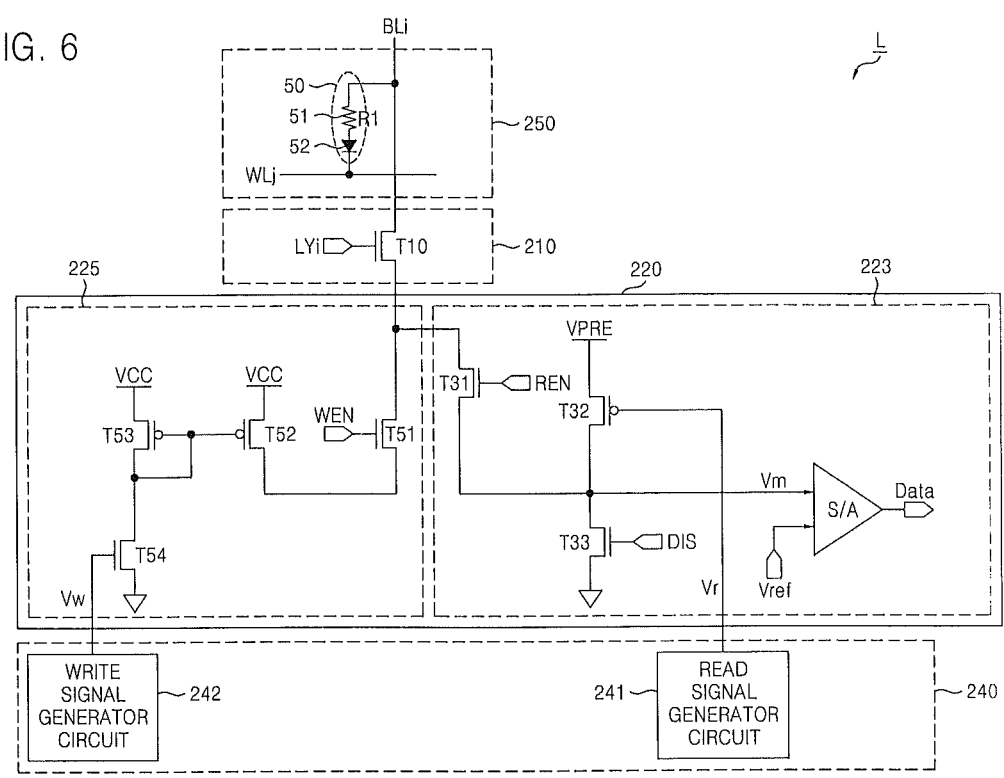
FIG. 6 is a schematic diagram of circuits included in area L illustrated in FIG. 1, in some embodiments according to the inventive concept.

FIG. 6 is a schematic diagram of circuits included in area L illustrated in FIG. 1, in some embodiments according to the inventive concept. Referring to FIG. 6, a phase change memory cell 50 is connected to a word line WLj (where "j" is 0 or a natural number) that is selected by the row address XADD and is connected to a bit line BLi (where "i" is 0 or a natural number) selected by the column address YADD. The phase change memory cell 50 includes a resistive memory element 51 and an access element 52. The resistive memory element 51 may be formed using a chalcogenide alloy and the access element 52 may be implemented as a diode, a metal-oxide-semiconductor field effect transistor (MOSFET), or a bipolar junction transistor (BJT). Other types of access elements may be used.

The column select circuit 210 connects the bit line BLi to the read/write circuit 220 responsive to a signal received from the column decoder 270. The read/write circuit 220 includes a read circuit 223 and a write circuit 225. The write circuit 225 includes first through fourth transistors T51, T52, T53, and T54. When a write enable signal WEN is activated (set to a logic high), the first transistor T51 is turned on and the write circuit 225 is electrically connected to the bit line BLi. The second and third transistors T52 and T53 form a current mirror structure and supply a set current I_set or a reset current I_reset to the memory cell 50 in response to a write control signal Vw applied to a gate of the fourth transistor T54.

The read circuit 223 includes first through third transistors T31, T32, and T33 and a sense amplifier S/A. When a read enable signal REN is activated (set to a logic high), the first transistor T31 is turned on and the read circuit 223 is electrically connected to the bit line BLi. When a discharge signal DIS is activated (set to a logic high), the third transistor T33 is turned on and the bit line BLi is initialized to a ground (or reference) voltage.

The analog/logic circuit 240 includes a read signal generator circuit 241 and a write signal generator circuit 242. When a read control signal Vr output from the read signal generator 241 of the analog/logic circuit 240 is activated (set to a logic low), the second transistor T32 of the read circuit 223 is turned on and the bit line BLi is charged to a precharge voltage VPRE. The sense amplifier S/A compares a read voltage Vm with a reference voltage Vref, detects the on- or off-state of the memory cell 50, and reads data.

As described herein, the voltages provided by the write signal generator circuit 242 can be controlled to provide different amounts of current to data cells and reference cells so that those respective cells are programmed to have, in some embodiments according to the present invention, different resistances. For example, reference cells can be programmed to have an initial programmed resistance that is less than that programmed to data cells storing a logic "1". Further, the read data signal generator circuit 241 can be provided with different voltage signals so that data read from reference cells is, in some embodiments according to the inventive concept, compared to the predetermined reference threshold resistance (represented by the signal provided by the read data signal generator circuit 241). In contrast, the read data signal generator circuit 241 provides a different signal when the data cell is read.

Figure 7:
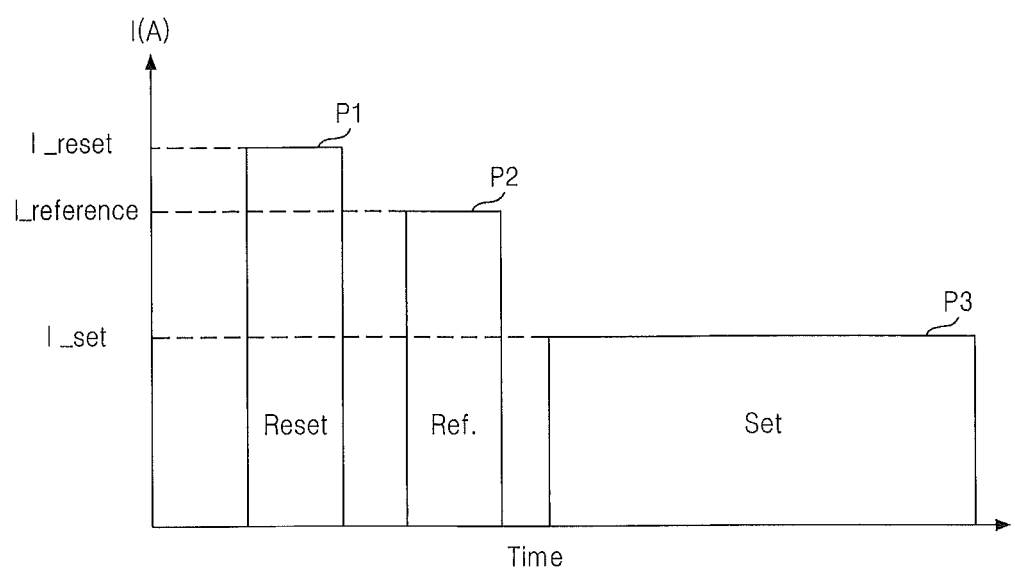
FIG. 7 is a graph illustrating current pulse amplitudes over time in some embodiments according to the inventive concept.

FIG. 7 is a graph illustrating current pulse amplitudes over time in some embodiments according to the inventive concept. According to FIG. 7, a reset current pulse P1, a reference current pulse P2, and a set current pulse P3 are different currents supplied to the phase change memory cell to store data during a write. The relative current intensities are shown in decreasing order where the reset current pulse P1 has the greatest intensity and the set current pulse P3, has the least intensity. Further, the duration of the set current pulse P3 is greater than the duration of the reset current pulse P1 and the duration of the reference current pulse P2.

It will be understood that the separation of the intensities and durations of the pulses has been provided for clarity in illustrating the exemplary differences between the pulses. In some embodiments according to the inventive concept, however, the different current pulses may be applied to the respective cells during the same or overlapping time intervals and, therefore, may not be separated in time as shown. In addition, in some embodiments according to the inventive concept, the intensity of each current pulse may not be constant during the entire duration so that the magnitude of the supplied current may vary over time.

The reset current pulse P1 is used to place a data cell in the reset state and the set current pulse P3 is used to place a data cell in the set state. The reference current pulse P2 is used to program the reference cell with the initial programmed resistance to be in the reference state which can be between the reset state and the set state. In some embodiments according to the inventive concept, however, the reference state coincides with the reset state.

Figure 8:
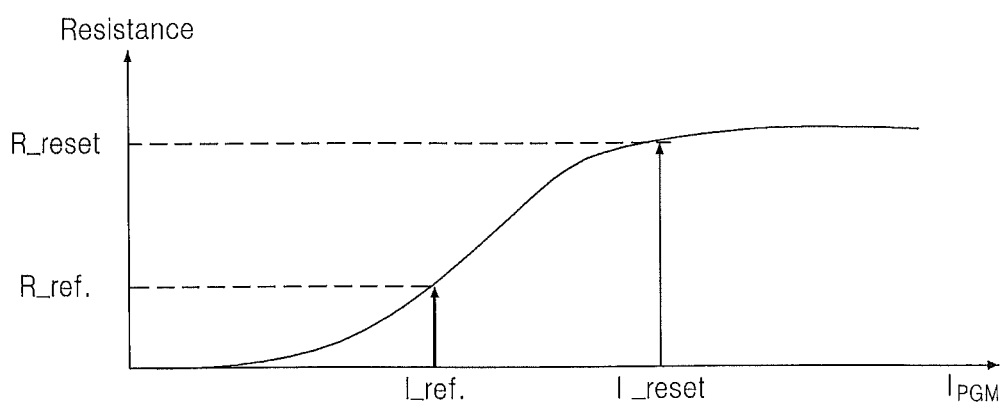
FIG. 8 is a graph illustrating resistance values programmed to reference cells and data cells in a PRAM device in some embodiments according to the inventive concept.

FIG. 8 is a graph illustrating current and resistance values used to program reference and data cells to the reset state in some embodiments according to the inventive concept. As described above with reference to FIG. 3, the reference cell can be programmed to the initial programmed resistance (to be in the reset state) using a current that is less than or equal to a current used to program a data cell in the reset state. Accordingly, when the PRAM device 200 is exposed to excessive temperatures, the state of the reference cell may be reduced to the crystalline state before the data cells are reduced to the crystalline state. Accordingly, upon a read, the reference cell may fail before the data cell, therefore providing early warning of impending likely failure of the data cells so that a rewrite operation of the data cells can be performed to avoid a data failure Referring to FIG. 8, the horizontal axis is current I used to change the phase of the phase change material, e.g., GST, and the vertical axis is the resistance R of the phase change material in the reset state for both the data and reference cells in some embodiments according to the inventive concept. The reset current I_reset is used to program the data cell with a logic "1", which provides a reset resistance R_reset. In contrast, the reference cell is programmed using I_ref to store a logic "1", but having the initial programmed resistance, R-ref, that is less than R_reset, but still enough resistance to be interpreted to be logic "1" during a read operation. In particular, I_ref sets the initial programmed resistance of the reference cell to a value that is greater than the predetermined data threshold resistance used to distinguish between data states. It will be understood that, although FIG. 8 shows the that the reference cell and the data cells can be programmed to different resistance levels within the reset state, in some embodiments according to the inventive concept, the reference cell and the data cells can be programmed to have about the same resistances within the reset state, as described, for example in reference to FIG. 14.

Figure 9:
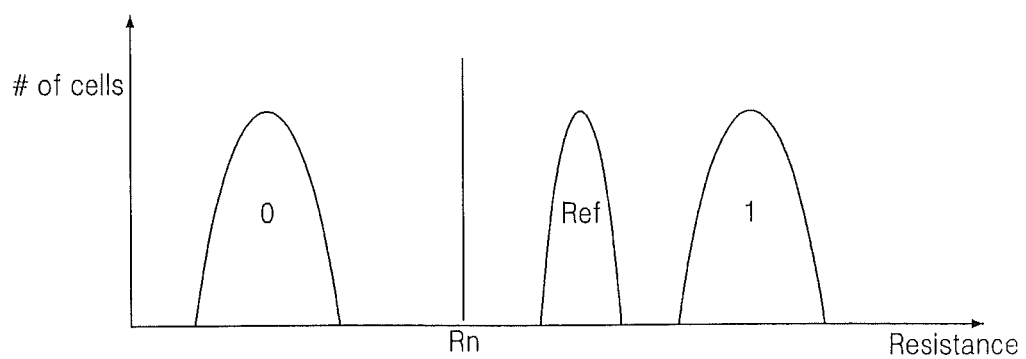
FIG. 9 is a graph illustrating statistical distributions in resistance values of PRAM cells programmed to be in a set state, a reference state, and a reset state in some embodiments according to the inventive concept.

FIG. 9 is a graph illustrating statistical distributions in resistance values of PRAM cells programmed to be in a set state, a reference state, and a reset state in some embodiments according to the inventive concept. As shown in FIG. 9, the distribution of initial programmed resistances programmed to the reference cells is less than the distribution of resistances for the data cells in the reset state but greater than a predetermined data threshold resistance Rn. It will be understood that the predetermined data threshold resistance Rn is used during a read operation to determine whether the read data is a logic "1" or logic "0". Accordingly, if data read from the reference cell is a logic "0" (i.e., in the set state), an error is generated because the initial programmed resistance stored in the reference cell has been reduced to less than the predetermined data threshold resistance Rn by excessive temperature.

In response, the data read from the data cells (along with the reference cell data) can be rewritten to the PRAM cells from which they were read to increase the likelihood that an error in the data can be avoided. In some embodiments according to the inventive concept, the initial programmed resistance is also rewritten to the reference cell that generated the error to return that reference cell to a higher resistance level to provide ongoing protection from excessive temperatures.

Figure 10:
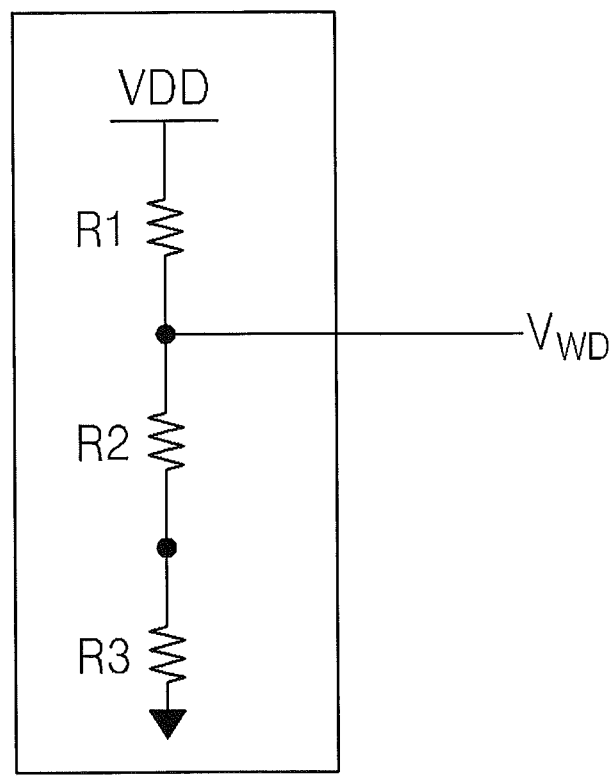
FIGS. 10 and 11 are schematic diagrams illustrating data and reference cell write signal generator circuits, respectively, in some embodiments according to the inventive concept.
Figure 11:
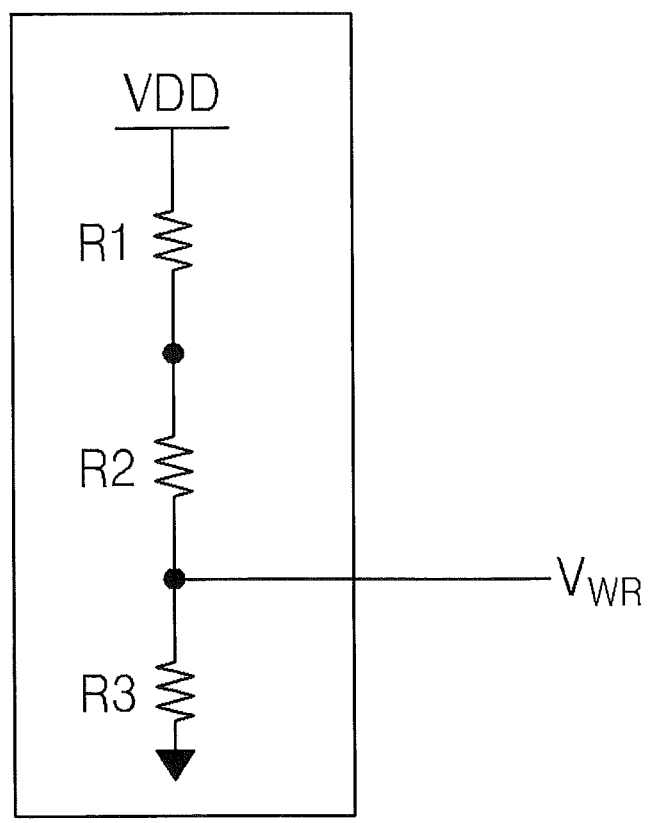

FIGS. 10 and 11 are schematic diagrams of the write signal generator circuits illustrated in FIG. 6 according to some embodiments of the inventive concept. In some embodiments according to the inventive concept, different currents, I_reset and I_ref, are provided to the data cells and to the reference cell, respectively, by write signal generators circuits 242a and 242b. The write signal generators circuits 242a and 242b, include a plurality of resistors R1 through R3 connected in series with one another. In some embodiments according to the inventive concept, the resistors R1 through R3 have the same or different resistances.

Referring to FIG. 10, the write signal generator circuit 242a transmits a first write control signal $V_{WD}$ to the write circuit 225 connected to the data cell. The first write control signal $V_{WD}$ is connected to a node between the resistors R1 and R2, as shown to provide the I_reset current.

Referring to FIG. 11, the write signal generator circuit 242b transmits a second write control signal $V_{WR}$ to the write circuit 225 connected to the reference cell. The second write control signal $V_{WR}$ is connected to a node between the resistors R2 and R3 as shown to provide the I_ref current. Accordingly, the second write control signal $V_{WR}$ is less than the first write control signal $V_{WD}$, so that the write current I_ref supplied to the reference cell is less than the write current I_reset supplied to the data cell.

Figure 12:
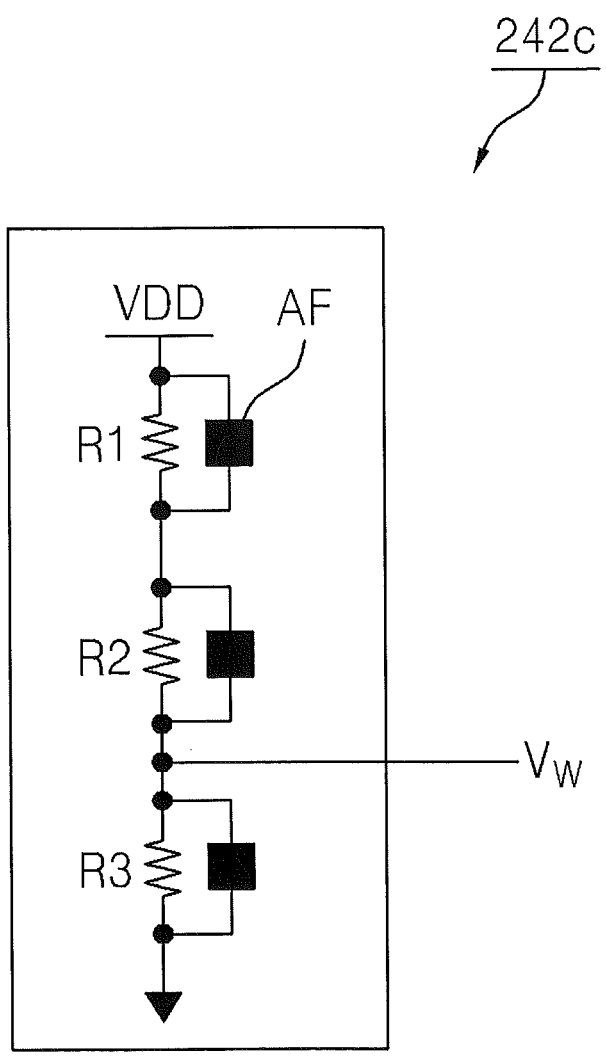
FIG. 12 is a schematic diagram illustrating a programmable data/reference cell write signal generator circuit in some embodiments according to the inventive concept.

FIG. 12 is a schematic diagram illustrating a programmable data/reference cell write signal generator circuit 242c in FIG. 6, in some embodiments according to the inventive concept. Referring to FIG. 12, the write signal generator circuit 242c includes a plurality of resistors R1 through R4 and a plurality of anti-fuses AF, each one of which is connected across a respective one of the plurality of resistors. The anti-fuses AF can be activated to remove the respective resistor, across which it is connected, from the circuit. In operation, any combination of resistors can be connected together to select a particular level for a write current to be used to program a cell (i.e., a data cell or a reference cell).

Figure 13:
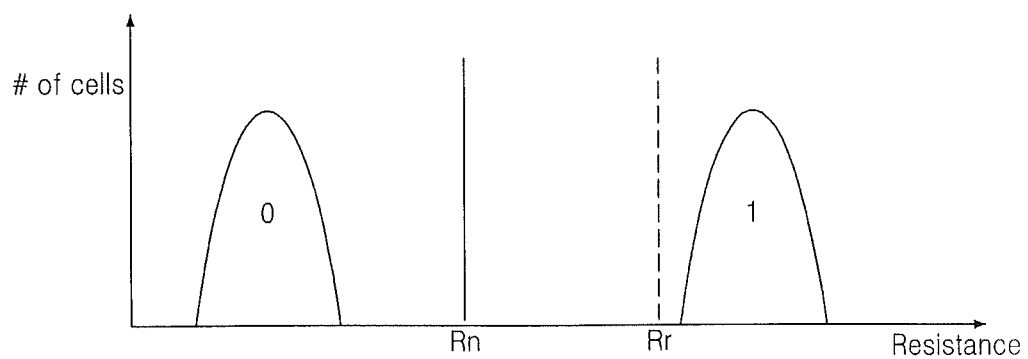
FIG. 13 is a graph illustrating statistical distributions of resistance values of PRAM cells programmed to be in a set state versus a reset state relative to a predetermined reference threshold resistance in some embodiments according to the inventive concept.

FIG. 13 is a graph illustrating statistical distributions of resistance values of PRAM cells programmed to be in a set state versus a reset state relative to a predetermined reference threshold resistance in some embodiments according to the inventive concept. According to FIG. 13, the initial programmed resistance of the reference cells is about equal to that for the data cells so that both fall within the statistical distribution of resistances shown as being a logic "1", A predetermined reference threshold resistance, Rr, is used during read operations to detect whether the initial programmed resistance of the reference cell has been reduced to a level indicating that an error in the data may occur in the future.

In particular, the resistance provided by the reference cell during the read is compared to the predetermined reference threshold resistance. If the resistance is greater than the predetermined reference threshold resistance, no error is generated. If, however, the resistance is less than the predetermined reference threshold resistance, an error is generated, whereupon a rewrite can be performed. Therefore, even though the data and reference cells may be programmed initially to have the same resistance, the resistance of the reference cells is monitored relative to the predetermined reference threshold resistance, Rr, which is above the predetermined data threshold resistance, Rn, and relatively close to the statistical distribution of resistances representing the reset state. In such an approach, it will be understood that the write signal generator circuits for both the reference and data cells can be structured the same.

Figure 14:
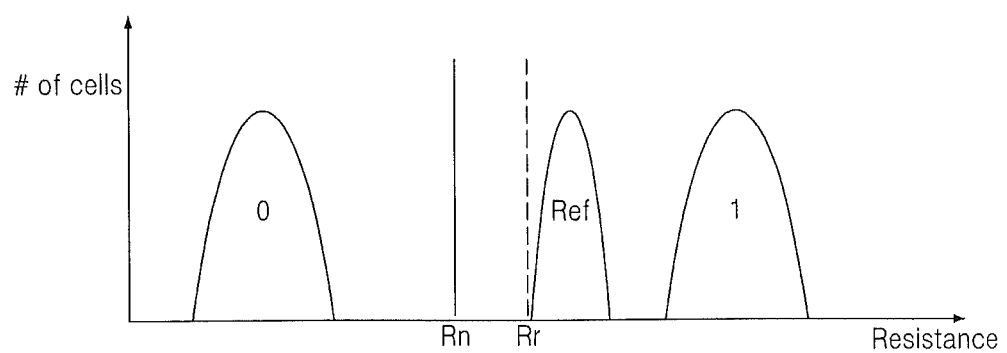
FIG. 14 is a graph illustrating statistical distributions of resistance values of PRAM cells programmed to be in a set state, a reset state, and a reference state relative to a predetermined reference threshold resistance in some embodiments according to the inventive concept.

FIG. 14 is a graph illustrating statistical distributions of resistance values of PRAM cells programmed to be in a set state, a reset state, and a reference state relative to a predetermined reference threshold resistance in some embodiments according to the inventive concept. According to FIG. 13, the initial programmed resistance of the reference cells is less than that of the data cells but greater than the predetermined data threshold resistance. Accordingly, both the reference cells and the selected data cells are in the logic "1" state even though their respective statistical distributions can be non-overlapping one another and both greater than the predetermined data threshold resistance. The predetermined reference threshold resistance, Rr, is less than the statistical distribution of the reference cells having and greater than the predetermined data threshold resistance, Rn. The predetermined reference threshold resistance is used during read operations to detect whether the initial programmed resistance of the reference cell has been reduced to a level indicating that an error in the data may occur in the future.

In particular, the resistance provided by the reference cell during the read is compared to the predetermined reference threshold resistance. If the resistance is greater than the predetermined reference threshold resistance, no error is generated. If, however, the resistance is less than the predetermined reference threshold resistance, an error is generated, whereupon a rewrite can be performed. It will be understood that in some embodiments according to the inventive concept, the predetermined reference threshold resistance can be about equal to the predetermined data threshold resistance, such as the embodiments described herein in reference to, for example, FIG. 9.

Figure 15:
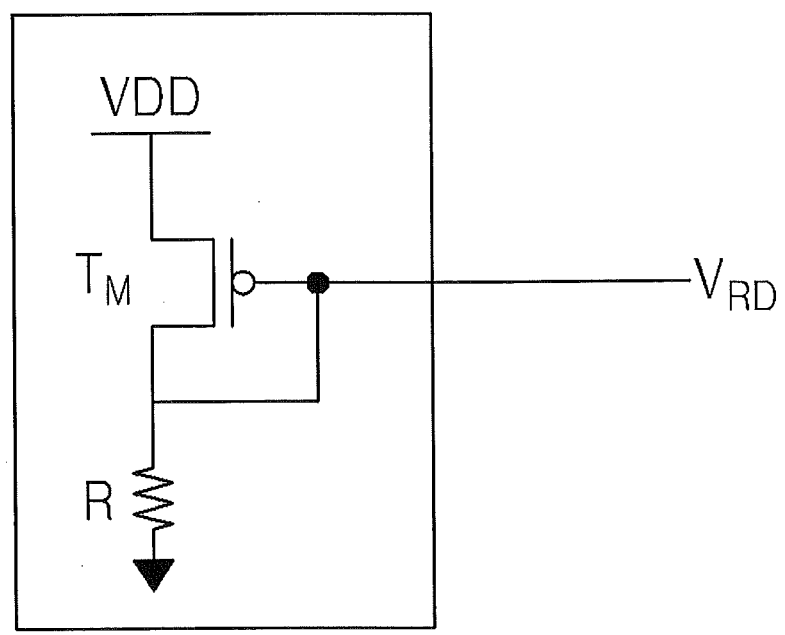
FIG. 15 is a schematic diagram illustrating a data cell read signal generator circuit in some embodiments according to the inventive concept.
Figure 16:
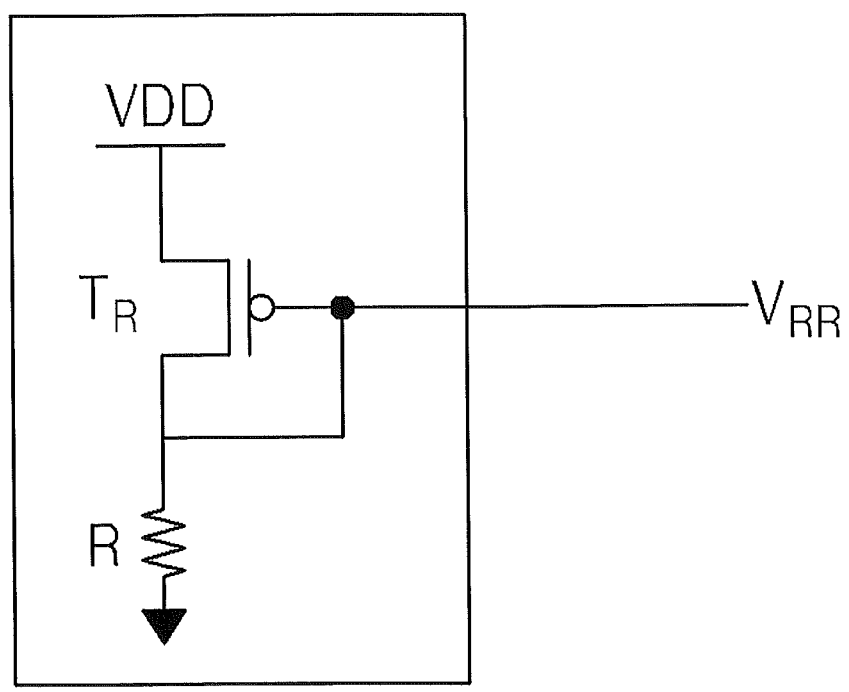
FIG. 16 is a schematic diagram illustrating a reference cell read signal generator circuit in some embodiments according to the inventive concept.

FIGS. 15 and 16 are diagrams of data and reference cell read signal generator circuits illustrated in FIG. 6, which can provide for different resistances for use in reading reference cells and data cells in some embodiments according to the inventive concept.

A second read control signal $V_{RR}$, which is greater than a level of a first read control signal $V_{RD}$, is applied to the P-type metal-oxide-semiconductor (PMOS) transistor T32 precharging the bit line BLi in the read circuit 223. This enables the read reference resistance of the reference cell, i.e., the predetermined reference threshold resistance, Rr, to be equal to or greater than the predetermined data threshold resistance, Rn.

Figure 17:
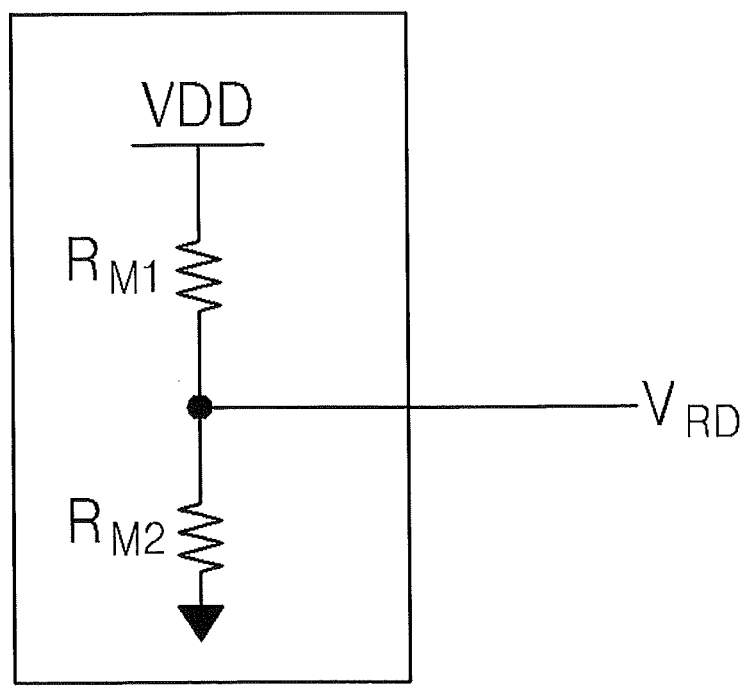
FIG. 17 is a schematic diagram illustrating a data cell read signal generator circuit in some embodiments according to the inventive concept.
Figure 18:
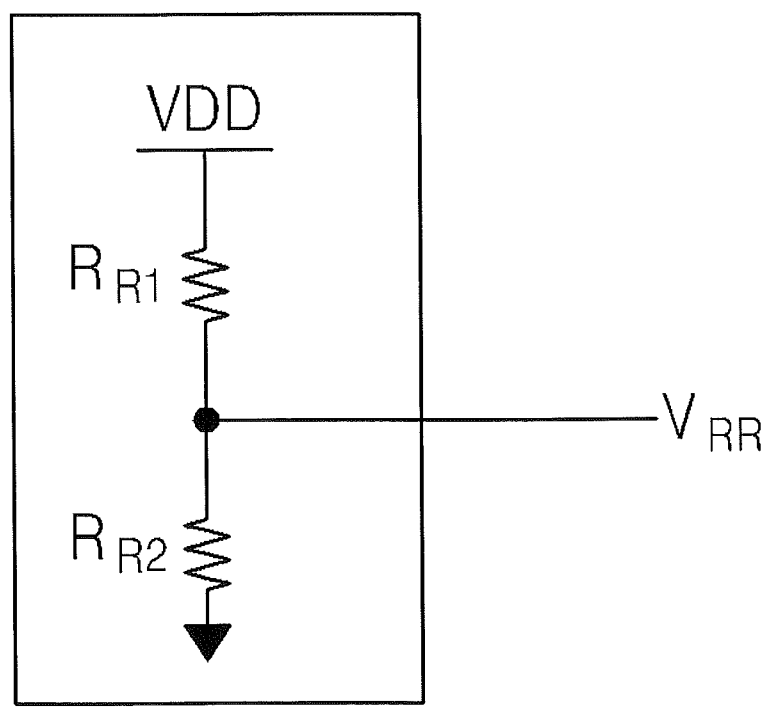
FIG. 18 is a schematic diagram illustrating a reference cell read signal generator circuit in some embodiments according to the inventive concept.

FIG. 15 shows a first read signal generator circuit 241a that provides the predetermined data threshold resistance for the data cell and FIG. 16 shows a second read signal generator circuit 241b that provides the predetermined reference threshold resistance for the reference cell. Each of the first and second read signal generator circuits 241a and 241b includes a PMOS transistor $T_M$ or $T_R$ and a resistor R. Each of the PMOS transistors $T_M$ and $T_R$ forms a current mirror structure together with the PMOS transistor T32 of FIG. 6 and fixes the level of the read control signal $V_{RD}$ or $V_{RR}$. A gate electrode of the PMOS transistor $T_M$, to which the first read control signal $V_{RM}$ is applied, is connected to a node between the PMOS transistor $T_M$ and the resistor R and has a fixed voltage, i.e., $V_{RD}=R*I_M$. The difference in the levels between the read control signal $V_{RD}$ and read control signal $V_{RR}$ may be controlled by the gate width of the PMOS transistors $T_M$ and $T_R$. When the gate width increases, a current flowing in the resistor R increases, and therefore, the voltage level of the gate electrode is increased. Accordingly, the gate width of the PMOS transistor $T_R$ in the second read signal generator 241b may be equal to or greater than the gate width of the PMOS transistor $T_M$ in the first read signal generator circuit 241a FIGS. 17 and 18 are schematic diagrams illustrating a data cell read signal generator circuit and a reference cell read signal generator circuit, respectively, in some embodiments according to the inventive concept. According to FIG. 17, the data cell read signal generator circuit 241c provides the predetermined data threshold resistance, Rn, for the data cell and includes a plurality of resistors $R_{M1}$ and $R_{M2}$ connected in series with one another. The read control signal $V_{RM}$ connected to a node between the resistors $R_{M1}$ and $R_{M2}$ has a voltage level given by the relationship: $VDD*(R_{M2}/(R_{M2}+R_{M1}))$.

The reference cell read signal generator circuit 241d illustrated in FIG. 18 provides the predetermined reference threshold resistance, Rr, for a reference cell and includes a plurality of resistors $R_{R1}$ and $R_{R2}$ connected in series with one another. The read control signal $V_{RR}$ is connected to a node between the resistors $R_{R1}$ and $R_{R2}$ has a voltage level given by the relationship: $VDD*(R_{R2}/(R_{R2}+R_{R1}))$. The resistances $R_{D1}, R_{D2}, R_{R1},$ and $R_{R2}$ may be controlled such that the read control signal $V_{RR}$ has a level that is equal to or greater than a level of the read control signal $V_{RD}$.

Figure 19:
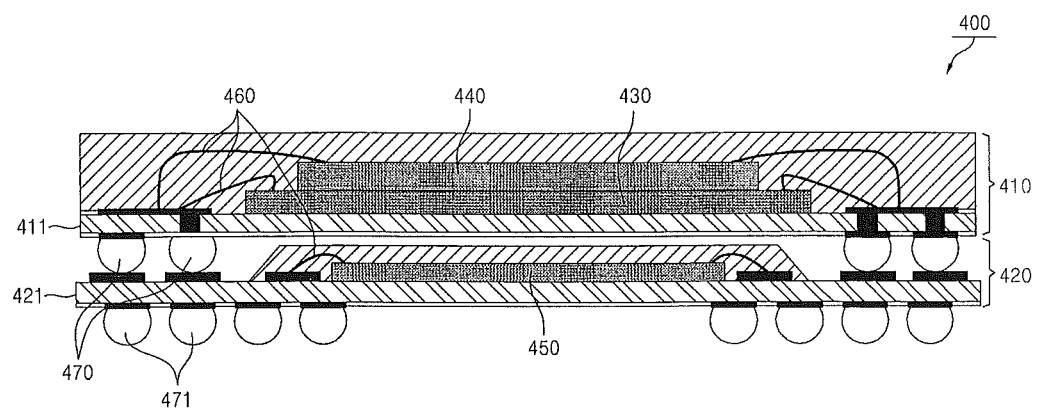
FIG. 19 is a cross-sectional view of a package-on-package (POP) semiconductor arrangement including a PRAM device in some embodiments according to the inventive concept.

FIG. 19 is a cross-sectional view of a package-on-package (POP) semiconductor arrangement including a PRAM device in some embodiments according to the inventive concept. The semiconductor POP 400 includes an upper package 410 and a lower package 420. The upper package 410 includes a first printed circuit board (PCB) 411, a plurality of stacked memory chips 430 and 440, a plurality of bonding wires 460, and a plurality of first solder balls 470. The memory chips 430 and 440 stacked on the first PCB 411 are electrically connected to the first PCB 411 via some of the bonding wires 460. The memory chips 430 and 440 may be implemented by sequentially stacking a dynamic memory device such as a DRAM and a non-volatile memory device including a resistive memory such as a NAND or NOR flash memory or a PRAM. The first solder balls 470 on the bottom of the first PCB 411 are bonded to ball lands formed on the top of the lower package 420 to electrically connect the packages 410 and 420 to each other.

The lower package 420 includes a second PCB 421, a logic device 450, a number of the plurality of bonding wires 460, and a plurality of second solder balls 471. The solder balls 471 on the bottom of the second PCB 421 electrically connect the semiconductor POP 400 to a motherboard or the like. The logic device 450 is positioned at the center of the second PCB 421. Some of the plurality of bonding wires 460 connect the logic device 450 to the second PCB 421. The logic device 450 may be used as a central processing device, which may generate heat during operation. Since the gap between the logic device 450 and the memory chips 430 and 440 may be small, the memory chips 430 and 440 can be exposed to excessive temperatures. The memory chips 430 and 440 may utilize a reference cell, as described herein, to provide an early warning of a data failure, whereupon a rewrite operation may be performed in some embodiments according to the inventive concept.

Figure 20:
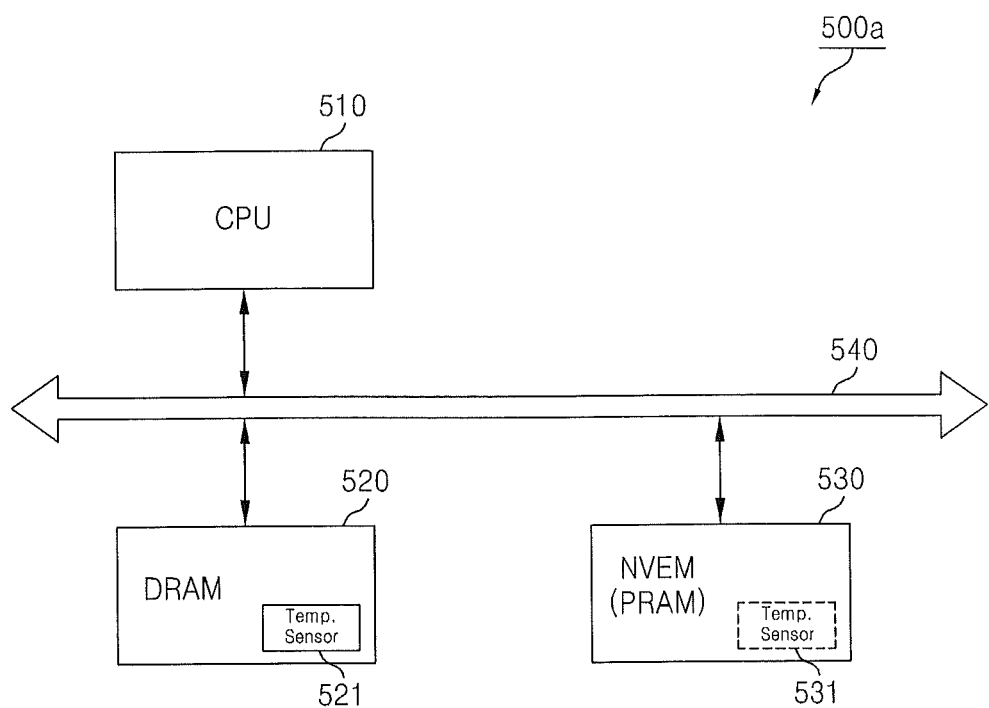
FIGS. 20-22 are block diagrams of systems including PRAM devices in some embodiments according to the inventive concept.
Figure 21:
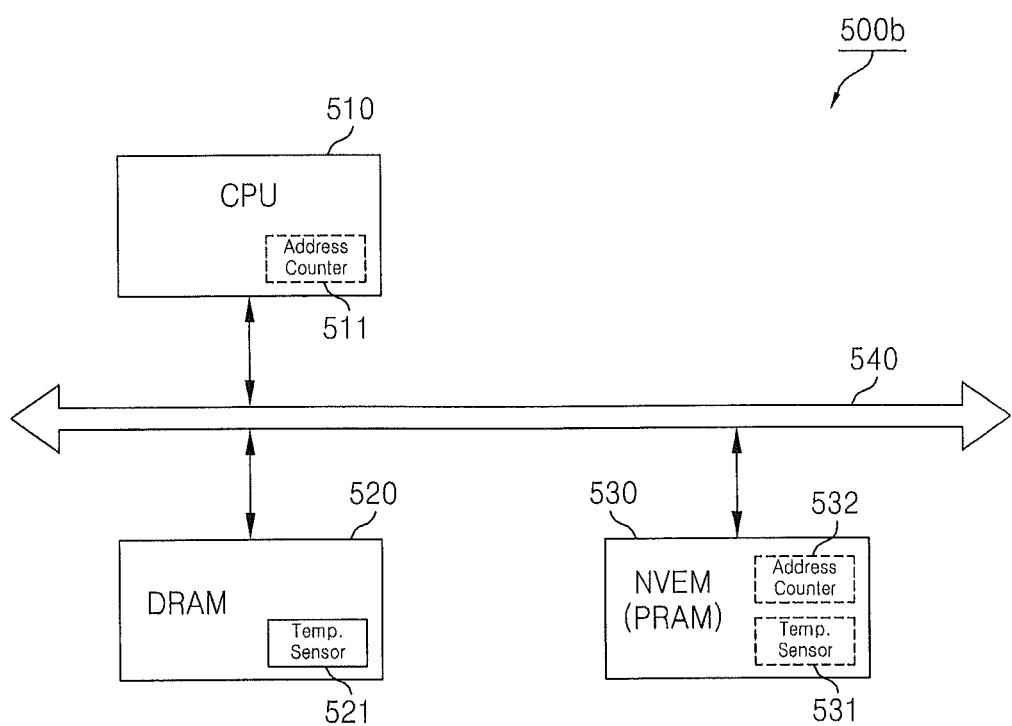
Figure 22:
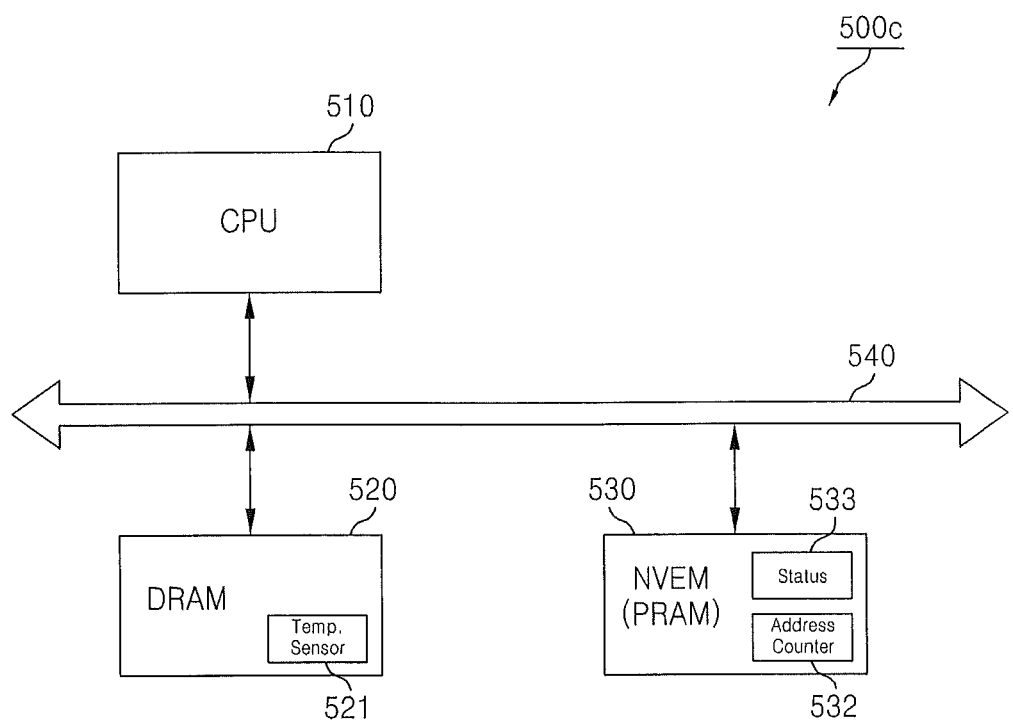

FIGS. 20-22 are block diagrams of systems including PRAM devices in some embodiments according to the inventive concept. Referring to FIG. 20, a computer system 500a includes a central processing unit CPU 510, a dynamic memory device, such as a DRAM 520, a non-volatile memory device such as a phase change memory device 530, and a system bus 540 connecting the other elements 510, 520, and 530 to one another. Since the phase change memory device 530 may be vulnerable to excessive temperatures, temperature sensors 521 and 531 may be used to check the operating environment of the system 500a.

In some embodiments according to the inventive concept, the DRAM 520 includes a temperature sensor 521, and may further allow temperature information to be stored in the DRAM 520, which may be accessed by the CPU 510 for use in the operation of the phase change memory device 530. The phase change memory device 530 may also include a temperature sensor 531. Temperature information sensed by the temperature sensors 521 and 531 may be used when the period of a reference cell read operation is adjusted or used to determined whether to perform a rewrite operation when a temperature at which the state of a phase change material is prone to change has been stored. For example, in some embodiments according to the invention, the reference cells may be monitored for errors during read operations when the temperature information indicates that the operating environment of the PRAM device 200 has reached level where errors may occur soon if unaddressed.

Referring to FIG. 21, the CPU 510 or the phase change memory device 530 may include an address counter 511 or 532, respectively. In operation the reference cells may be periodically and/or aperiodically read and monitor for errors as described herein. In some embodiments according to the inventive concept, the CPU 510 can transmit a reference read command to the phase change memory device 530, whereupon the phase change memory device 530 reads the addressed reference cell. In particular, the CPU 510 may load an address of a selected reference cell into the address counter 511 included in the CPU 510 as part of the reference read command.

When the address counter 532 is provided in the phase change memory device 530, the address counter 532 counts the address of the reference cell in response to the reference read command received from the CPU 510, so that data is read from the reference cell. Alternatively, data may be read from the reference cell with a predetermined period using a controller provided in the phase change memory device 530. In some embodiments according to the inventive concept, the period of a read operation may be controlled by the temperature sensors 521 and 531.

Referring to FIG. 22, the phase change memory device 530 may also include a status check unit 533 apart from the address counter 532. When the phase change memory device 530 controls a rewrite operation, phase change memory device 530 avoids collisions between operations provided by, for example, the CPU 510 and those of the phase change memory device 530. To avoid the collision, information about whether to perform the rewrite operation and relevant cell address information may be stored in the status check unit 533 and transmitted to the CPU 510.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A method of operating a Variable Resistance Memory comprising:
   reading a reference cell to determine an initial programmed resistance of the reference cell; and
   determining whether the initial programmed resistance has been reduced to below a predetermined reference threshold resistance; and
   rewriting the reference cell to the initial programmed resistance when it is determined that the initial programmed resistance programmed to the reference cell has been reduced to less than the predetermined reference threshold resistance.

2. The method according to claim 1 wherein the predetermined reference threshold resistance is greater than a predetermined data threshold resistance used to distinguish between different data states stored in a data cell.

3. The method according to claim 2 wherein first resistances greater than the predetermined data threshold resistance represent a reset state of the data cell and second resistances less than the predetermined data threshold resistance represent a set state of the data cell.

4. The method according to claim 1 wherein reading the reference cell comprises repeatedly reading the reference cell without an intervening rewrite operation of the reference cell until determining that the initial programmed resistance of the reference cell has been reduced to below the predetermined reference threshold resistance; and then
   rewriting the reference cell to have the initial programmed resistance.

5. A method according to claim 2 wherein the predetermined reference threshold resistance is less than a statistical distribution of resistances provided by programming a plurality of data cells in a reset state.

6. A method according to claim 1 wherein the initial programmed resistance of the reference cell is included in a statistical distribution of resistances provided by programming a plurality of data cells in a reset state.

7. A method according to claim 2 wherein the initial programmed resistance of the reference cell is less than a statistical distribution of resistances provided by programming a plurality of data cells in a reset state.

8. A method according to claim 1 wherein reading the reference cell comprises periodically reading the reference cell according to a reference cell time interval.

9. The method according to claim 8 wherein the reference cell time interval is reduced responsive to an increase in a temperature associated with the memory and is increased responsive to a decrease in the temperature associated with the memory.

10. The method according to claim 8 wherein the reference cell is included in a plurality of reference cells each associated with a particular region of the memory selected based on a likelihood to exhibit a high operating temperature.

11. The method according to claim 10 wherein the region of the memory is proximate to a current driver circuit.

12. The method according to claim 10 wherein the region of the memory is proximate to a central portion of a block of cells in the memory.

13. A Variable Resistance Memory comprising:
a control circuit configured to read a reference cell to determine that an initial programmed resistance of the reference cell has been reduced to below a predetermined reference threshold resistance, wherein the initial programmed resistance of the reference cell is included in a statistical distribution of resistances provided by programming a plurality of data cells in a reset state.

14. The Variable Resistance Memory according to claim 13 wherein the predetermined reference threshold resistance is greater than a predetermined data threshold resistance used to distinguish between different data states stored in a data cell in the memory.

15. The Variable Resistance Memory according to claim 14 wherein first resistances greater than the predetermined data threshold resistance represent a reset state of the data cell and second resistances less than the predetermined data threshold resistance represent a set state of the data cell.

16. The Variable Resistance Memory according to claim 13 wherein reading the reference cell comprises repeatedly reading the reference cell without an intervening rewrite operation of the reference cell until determining that the initial programmed resistance of the reference cell has been reduced to below the predetermined reference threshold resistance and then
rewriting the reference cell to have the initial programmed resistance.

17. The Variable Resistance Memory according to claim 14 wherein the predetermined reference threshold resistance is less than the statistical distribution of resistances.

18. The Variable Resistance Memory according to claim 14 wherein the initial programmed resistance of the reference cell is less than the statistical distribution of resistances.

19. A Variable Resistance Memory comprising:
a control circuit configured to read a reference cell to determine that an initial programmed resistance of the reference cell has been reduced to below a predetermined reference threshold resistance and configured to rewrite the reference cell to the initial programmed resistance when it is determined that the initial programmed resistance programmed to the reference cell has been reduced to less than the predetermined reference threshold resistance.

* * * * *